US005579397A

United States Patent [19]

Ikeda et al.

[11] Patent Number: 5,579,397
[45] Date of Patent: Nov. 26, 1996

[54] AMPLIFIER DEVICE FOR A CONDENSER MICROPHONE

[75] Inventors: Masaharu Ikeda; Ryoji Abe, both of Yokohama, Japan

[73] Assignee: Matsushita Electric Industrial Co., Ltd., Osaka, Japan

[21] Appl. No.: 305,348

[22] Filed: Sep. 13, 1994

[30] Foreign Application Priority Data

Jan. 21, 1994 [JP] Japan .................. 6-005218

[51] Int. Cl.⁶ ........................................... H04R 3/00
[52] U.S. Cl. .............................. 381/113; 381/120
[58] Field of Search ........................ 381/113, 120

[56] References Cited

U.S. PATENT DOCUMENTS 3,512,100  5/1970  Killion et al. .
4,414,433  11/1983  Horie ........................... 381/113

FOREIGN PATENT DOCUMENTS 2105147  3/1983  United Kingdom .
2161044  1/1986  United Kingdom .

OTHER PUBLICATIONS

Patent Abstracts of Japan, vol. 11, No. 277 (E-538) 8 Sep. 1987 & JP-A-62 076 907 (Toshiba Corp.) 9 Apr. 1987.
"Linear Applications vol. 1", Dec. 79, pp. 1–3.

Primary Examiner—Curtis Kuntz
Assistant Examiner—Minsun Oh
Attorney, Agent, or Firm—Watson Cole; Stevens Davis, P.L.L.C.

[57] ABSTRACT

A common-source type buffer amplifier circuit has a microphone capsule, a diode and an FET. An output end of the buffer amplifier circuit, or a drain of the FET is connected to an input end of the current mirror circuit. An output end of the current mirror circuit is connected to one end of a load resistor of which the other end is grounded. A voltage across the load resistor corresponds to an output of the amplifier and is supplied to the speaker amplifier.

14 Claims, 3 Drawing Sheets

5,579,397

AMPLIFIER DEVICE FOR A CONDENSER MICROPHONE

BACKGROUND OF THE INVENTION

This invention relates to an amplifier device for use with a condenser microphone.

FIGS. 4 and 5 show the circuit arrangements of typical conventional amplifiers for use with condenser microphones (hereinafter, referred to simply as microphones). These arrangements are different chiefly in their buffer amplifiers. These buffer amplifiers are of FET common-source type as in FIG. 4 and FET source-follower type as in FIG. 5. The general buffer amplifier is formed by combining a microphone capsule with such a buffer amplifier into a microphone unit. Each of the conventional arrangements will be described in order.

Referring to FIG. 4, there are shown a microphone capsule 1, and a common-source type buffer amplifier circuit 11 which is formed of a diode 2 and an FET 3. The output terminal of an amplifier 401 corresponds to an amplifier output terminal 15 to which the drain of the FET 3 is connected. This amplifier output terminal is also connected through a load resistor 43 to a ripple filter 402. The ripple filter 402 serves to remove noise such as ripples superimposed on a power source 5. In addition, there is shown a speaker amplifier 110 which is formed of a power amplifier circuit 6 and a loudspeaker 7. This speaker amplifier acts to amplify the output signal that is supplied from the buffer amplifier circuit 11 through the amplifier output terminal 15 and a ground terminal 14, and to convert the amplified signal into a sound through the loudspeaker 7.

The operation of this conventional arrangement will now be described. An acoustic pressure signal is converted into a voltage signal by the microphone capsule 1 and supplied to the gate of the FET 3 that is biased by the diode 2. This voltage signal is converted into a current signal by the mutual conductance of the FET 3. Since the drain of the FET 3 is connected through the load resistor 43 and ripple filter 402 to the power source, the current signal is again converted into a voltage signal by the load resistor 43. Since the drain current of the FET 3 is almost not changed with the change of the drain-source voltage because of its characteristics, it can be considered that approximately a current source is present at the drain output terminal. Eventually, the acoustic pressure signal applied to the microphone capsule 1 appears across the load resistor 43 in the form of a voltage signal proportional to its magnitude.

The audio voltage signal developed across the load resistor 43 is supplied to the input of the power amplifier circuit 6, thereby being amplified to an extent necessary for driving the loudspeaker. The power amplifier circuit 6 is constructed to operate on a single power source in order to simplify its arrangement. For this reason, one end of the input of the power amplifier circuit 6 to which the voltage signal is applied is connected to the minus side of the power source 5, or to the ground terminal 14. Therefore, it is necessary that the output signal produced from the buffer amplifier circuit 11 to appear across the load resistor 43 be generated between the amplifier output terminal 15 and the ground terminal 14.

The above condition can be satisfied by equivalently AC-grounding the power source to which the load resistor 43 is connected, or shunting it only for AC. For this purpose, the ripple filter 402 is provided to satisfactorily reduce the AC components superimposed on the power source 5. If the power source to the load resistor 43 includes a ripple, the sum of the audio signal developed across the load resistor 43 and the ripple voltage is supplied to the input terminal of the power amplifier circuit 6, incurring the increase of unnecessary noise.

The amplifier 401 including the common-source type buffer amplifier circuit 11 as shown in FIG. 4 must be thus constructed to fully reduce the AC noise superimposed on the power source since the acoustic pressure signal applied to the microphone capsule 1 appears across the load resistor 43 one end of which is connected to the power source.

In an amplifier 501 using an FET source-follower type buffer amplifier circuit 31 as shown in FIG. 5, the acoustic pressure signal applied to the microphone capsule 1 appears across a load resistor 33. Since one end of the load resistor is grounded, there is almost no effect of the AC noise of the power source and thus it is not necessary to provide the ripple filter 402. However, the operation to draw out the voltage signal in the source-follower type is different from that in the common-source type and thus the phases of the signals in both cases are opposite to each other. Although the acoustic pressure signal applied to the microphone capsule 1 has the same phase in both cases, the phase of the voltage signal produced from the output terminal 15 in one case is opposite to that in the other case. The buffer amplifier circuit 31 has a small output impedance because of the source-follower configuration and thus the drain output end can be approximately regarded as a voltage source.

This opposite-phase relation between both cases causes a problem when a plurality of microphones are connected to the speaker amplifier so that the signals therefrom are mixed. When the microphones of opposite phases, or of different types are used close to each other, the acoustic pressure signal from the same sound source is applied to those microphones, and thus the amplifiers of the microphones produce signals of opposite phases, respectively. Since those signals are mixed, particularly the low-frequency components of the signals cancel out each other, changing the tone of the produced signal. In order to avoid this problem, it is generally practiced to equalize the phases of the signals fed from the microphones to the amplifiers.

However, the conventional amplifier including the FET common-source type buffer amplifier circuit shown in FIG. 4, in which the output terminal of the buffer amplifier circuit is connected through the load resistor to the power source, is easily affected by the ripple of the power source and thus needs a ripple filter before the power source so that the AC components can be removed from the power source. This results in making the amplifier complicated in construction.

In addition, the amplifier using the common-source type buffer amplifier circuit shown in FIG. 4 and the amplifier using the FET source-follower type buffer amplifier circuit shown in FIG. 5 are required to produce signals of the same phase. Since the conventional small microphones cannot include such means for making the phases equal, phase-switching means must be separately provided in the apparatus to which these amplifiers will be probably connected. In this case, however, the microphone of which the phase should be inverted cannot be distinguished from the other microphones from the external appearance of that microphone. Thus, an additional operation for examining the types of the microphones to be used is necessary before achieving the proper phase adjustment among the microphones.

SUMMARY OF THE INVENTION

It is an object of the invention to provide an amplifier with the above problems solved, or an amplifier capable of using even the FET common-source type buffer amplifier circuit with almost no effect of the ripple of the power source and which has a phase-reversing function for equalizing the phase of signal even in the FET common-source type or FET source-follower type buffer amplifier, thus the connecting operation being simplified.

In order to achieve the above object, the present invention proposes as the first arrangement an amplifier including buffer amplifier means with the output end approximately serving as a current source and current mirror means with the output end approximately serving as a current source.

In addition, the present invention proposes as the second arrangement another amplifier including current mirror means with the out-put end approximately serving as a current source and connecting and disconnecting means.

According to the first arrangement of the invention, since an audio current signal produced at the output terminal of the buffer amplifier means with the output end approximately serving as a current source is changed in the direction by the current mirror means and then caused to flow in the load resistor across which an audio voltage signal is thus developed, there is almost no effect of the ripples of the power source and the phase can be inverted.

According to the second arrangement of the invention, since the current mirror means and the connecting and disconnecting means which interfaces between the buffer amplifier means and the input and output terminals of the current mirror means are provided in the apparatus which the buffer amplifier means can be connected to or disconnected from, the buffer amplifier means of one type with the output end substantially serving as a current source or the other type with the output end substantially serving as a voltage source can be connected with ease and in this case the phases in both types can be automatically equalized particularly without being conscious of the type of the microphone, or the buffer amplifier means.

DESCRIPTION OF THE PREFERRED EMBODIMENTS

Figure 1:
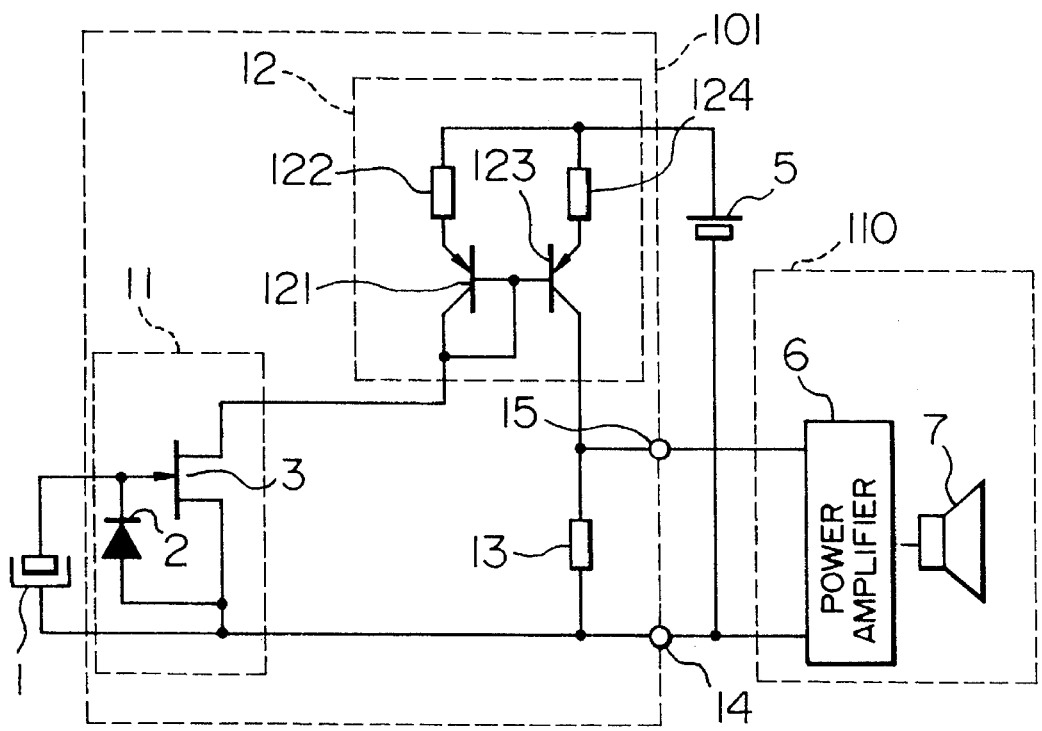
FIG. 1 shows a circuit diagram of an amplifier of the first embodiment of the invention.
Figure 4:
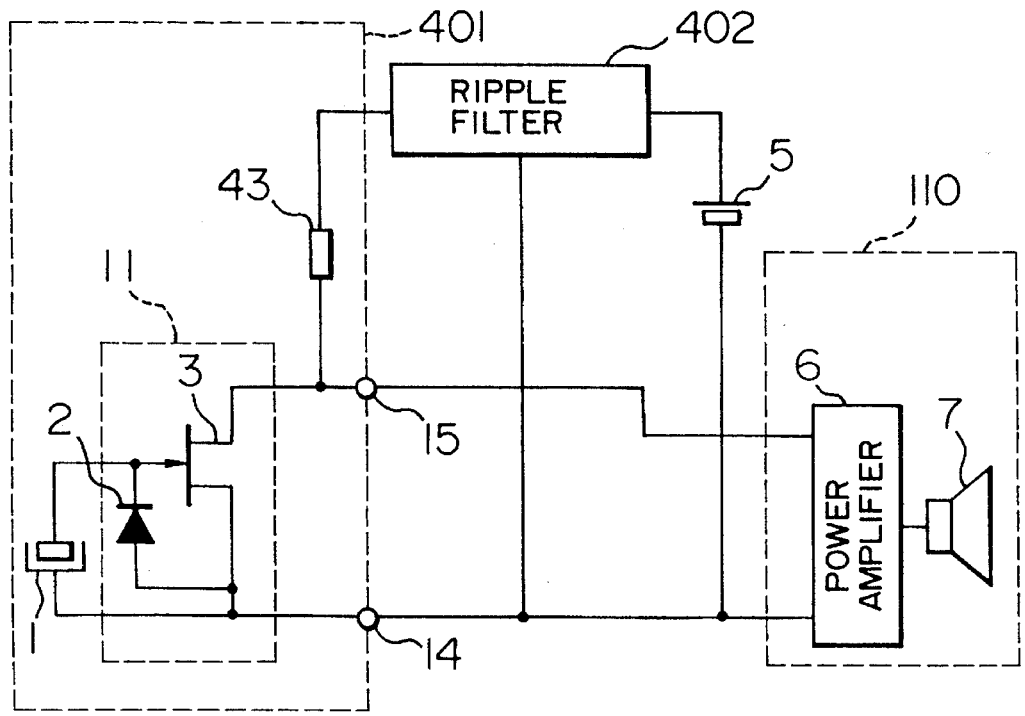
FIG. 4 shows a circuit diagram of a conventional amplifier having an FET common-source type buffer amplifier circuit.

The first embodiment of the invention will be described with reference to FIG. 1. In FIG. 1, like elements corresponding to those in FIG. 4 are identified by the same reference numerals. Thus the microphone capsule 1, diode 2, FET 3, common-source buffer amplifier circuit 11, output terminal 15 of the amplifier, ground terminal 14, power source 5, power amplifier circuit 6, loudspeaker 7 and speaker amplifier 110 are the same as in FIG. 4. The output end of the buffer amplifier circuit 11, or the drain of the FET 3 is connected to the input end of a current mirror circuit 12. The output end of the current mirror circuit is connected to one end of a load resistor 13 the other end of which is grounded. The output end of the current mirror 12 serves as the output terminal 15 of the amplifier 101 and is connected to an input end of the speaker amplifier 110. The current mirror circuit 12 has transistors 121, 123 and resistors 122, 124.

The operation of the first embodiment will now be described. An acoustic pressure signal applied to the microphone capsule 1, as in the conventional example of FIG. 4, is converted into a current signal, or a drain current by the FET 3. This drain current is caused to flow into the input of the current mirror circuit 12. If the transistors 121, 123 have the same characteristics and the resistors 122, 124 have the same value, a collector current Ic of the same quantity as the drain current of the FET 3 flows from the transistor 123. When the collector current Ic flows through the load resistor 13, a voltage signal is developed across the load resistor. The acoustic pressure signal applied to the microphone capsule 1 eventually appears across the load resistor 13 as a voltage signal proportional to the magnitude of the acoustic pressure signal.

If now a ripple is superimposed on the power source 5, the source-drain voltage of the FET 3 is changed. The current proportional to the magnitude of the acoustic pressure signal and which appears as the drain current of FET 3, however, is almost not affected by this voltage change. This is because the equivalent AC resistance of the drain of FET 3 is extremely large as well known so that it can be regarded as a current source. In other words, even though a ripple is superimposed on the power source 5, the drain current of FET 3 which is proportional to the magnitude of the acoustic pressure signal flows into the input end of the current mirror circuit 12 with almost no effect of the ripple thereon.

Since the output end of the current mirror circuit 12 corresponds to the collector of the transistor 123, the equivalent AC resistance is great enough to make the collector current regarded as a current source. The collector current Ic of the transistor 123 is determined by the base-emitter voltage of the transistor but is not affected by the collector-emitter voltage change because the base-emitter voltage is dependent on the drain current of FET 3. Therefore, the output current from the current mirror circuit 12 is almost not affected by the ripple of the power source 5. Eventually, the voltage signal which appears across the load resistor 13 and is proportional to the magnitude of the acoustic pressure signal applied to the microphone capsule 1 is also almost not affected by the ripple of the power source 5.

In addition, the voltage produced between the output terminal 15 and the ground terminal 14 when the drain current of FET 3 is increased is decreased in the conventional example of FIG. 4, but it is increased in the embodiment of FIG. 1 because of the difference between the circuit arrangements. In other words, the phase of the voltage in the embodiment of FIG. 1 is reversed to that in the conventional example using the FET common-source buffer amplifier circuit 11 of FIG. 4. Therefore, the phase of the output of the amplifier 101 of the embodiment of FIG. 1 is equal to that of the conventional amplifier 501 using the FET source-follower buffer amplifier circuit 31 shown in FIG. 5.

Thus, the amplifier of the first embodiment is not easily affected by such noise as the ripple of the power source and is able to achieve the function for reversing the phase.

While in this embodiment the current mirror circuit 12 has the resistors 122, 124 provided between the power source and the emitters of transistors 121, 123, this circuit arrangement is advantageous in using two discrete transistors of which the characteristics are alike but have a slight difference in values due to the dispersion. In other words, by using the resistors 122, 124 of a large value it is possible to make the transistors 121, 123 immune to the difference in their base-emitter voltages and current amplification factors HFE for achieving the same collector current, and also to increase the equivalent AC resistance at the output end of the current mirror circuit 12. However, since a large voltage drop is developed across the resistors, this arrangement is not suited for the application using a low-voltage source. If these transistors can be formed on a single silicon chip for a semiconductor integrated circuit and hence have just the same characteristics since they are produced under the same conditions, the resistance value of these resistors may be reduced or in some case these resistors can be omitted.

Moreover, while in the above embodiment the input current and output current of the current mirror circuit 12 are equal, they may be unequal.

Also, while in the above embodiment the current mirror circuit 12 is formed by bipolar transistors, the current mirror circuit may be formed of any elements as long as it has a large equivalent AC resistance at the output end and can be considered as a current source.

Furthermore, the current mirror circuit 12 in the above embodiment is expected to have a linearity between the input current and the output current in order that a distortion can be prevented from occurring between the input current and the output current. However, when the AC component of the voltage applied to the gate of FET 3 increases, the non-linearity in the relation of the amount of change of the drain current to the amount of change of the gate voltage increases, causing a distortion in the voltage-current conversion. In order to cancel out this distortion by a reverse characteristic, it is possible to give a non-linearity to the input-output characteristic of the current mirror circuit. This can be easily achieved by using the resistors 122, 124 of different values in the current mirror circuit 12.

Figure 2:
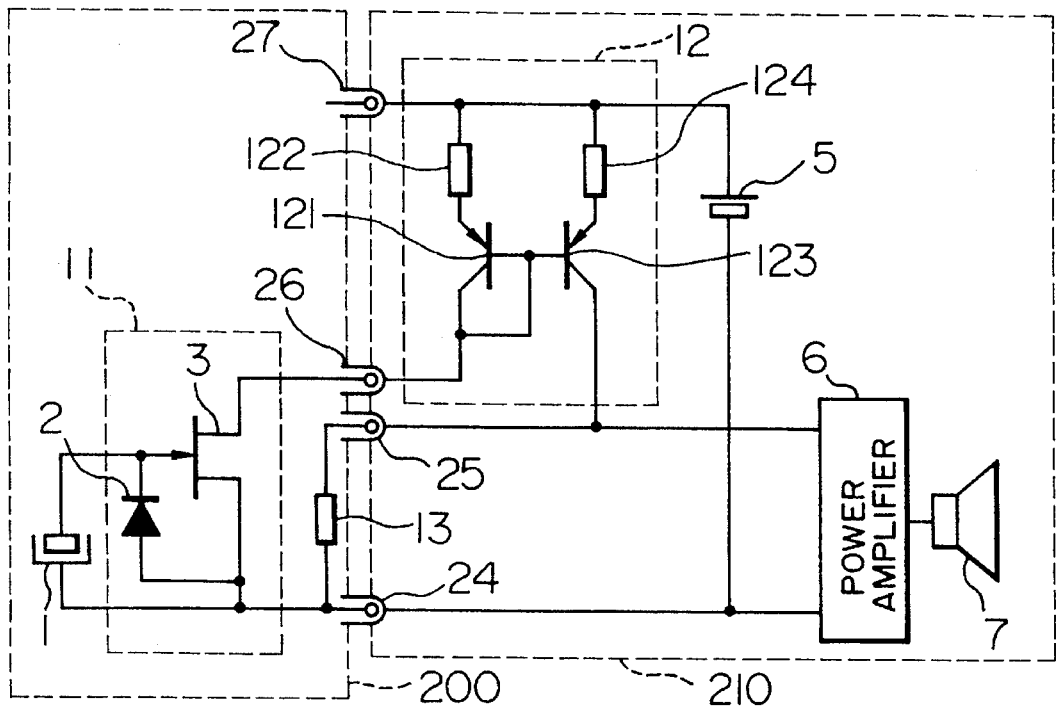
FIG. 2 shows a circuit diagram of an amplifier with an FET common-source buffer amplifier circuit connected, of the second embodiment of the invention.

The second embodiment of the invention will be described with reference to FIG. 2. In FIG. 2, like elements corresponding to those in FIG. 1 are identified by the same reference numerals. A microphone unit 200 is formed of the microphone capsule 1, the common-source buffer amplifier circuit 11 and the load resistor 13. A speaker amplifier 210 is formed of the current mirror circuit 12, the power source 5, the power amplifier circuit 6 and the loudspeaker 7. Connection terminals 24, 25, 26 and 27 serve as connecting and disconnecting means for detachably connecting the microphone unit 200 and the speaker amplifier 210.

This embodiment is different from the first embodiment in the following facts. The amplifier is constructed as the microphone unit 200, the current mirror circuit 12 is incorporated in the speaker amplifier 210, the load resistor 13 for the output voltage is connected within the microphone unit 200, and the microphone unit 200 and the speaker amplifier 210 are connected by the connecting and disconnecting means 24, 25, 26 and 27. Except for these differences in the arrangement, the whole electrical arrangement over the microphone unit and speaker amplifier is the same as in the first embodiment and thus the operation of this embodiment is the same as in the first embodiment.

Figure 3:
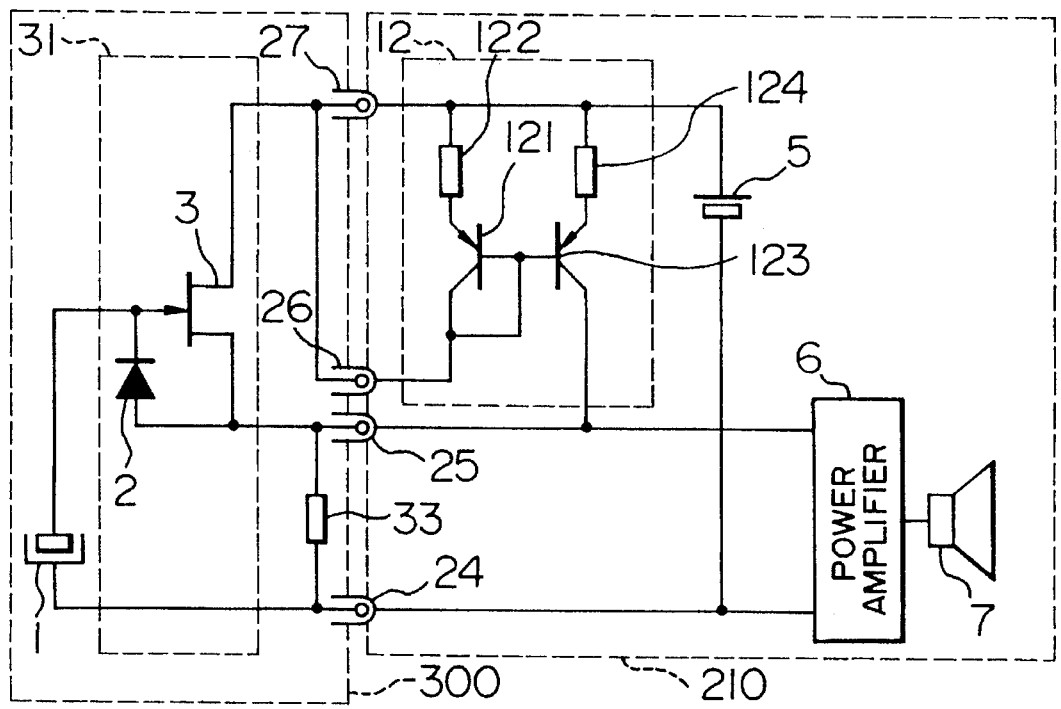
FIG. 3 shows a circuit diagram of an amplifier with an FET source-follower type buffer amplifier circuit connected, of the third embodiment of the invention.

FIG. 3 shows the third embodiment of the invention. The speaker amplifier 210 is the same as in FIG. 2, but a microphone unit 300 is formed of a FET source-follower type buffer amplifier circuit 31 same as in the conventional example of FIG. 5, the microphone capsule 1 and the connecting and disconnecting means 24, 25, 26 and 27. Therefore, since the speaker amplifier 210 and the connection terminals 24, 25, 26 and 27 are common to the arrangements of FIGS. 2 and 3, either one of the microphone units 200 and 300 can be connected to the speaker amplifier through the connection terminals.

Figure 5:
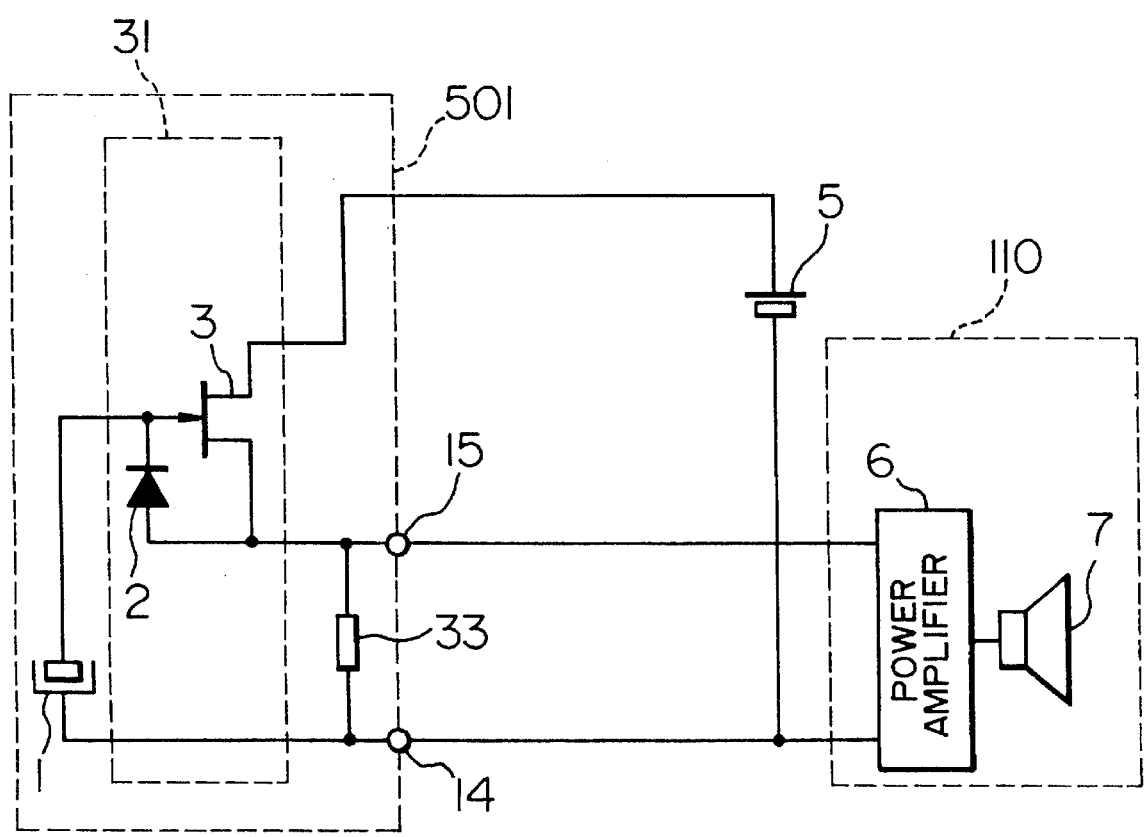
FIG. 5 shows a circuit diagram of another conventional amplifier having an FET source-follower type buffer amplifier circuit.

The arrangement of the third embodiment is the same as in the conventional example of FIG. 5 except for the current mirror circuit 12. Since in this circuit arrangement the input end of the current mirror circuit 12 is connected to the power source so that the current is not prevented from flowing, the output current also does not flow and thus does not affect the node of the connecting and disconnecting means 25 at all. In other words, the current mirror circuit 12 is actually connected but equivalently disconnected since no current flows therethrough. Therefore, the electric connection is substantially the same as in the conventional example of FIG. 5 and thus the operation is also the same.

Thus, in the embodiments of FIGS. 2 and 3, since the current mirror circuit 12 and the connecting and disconnecting means 24, 25, 26 and 27 are provided at the input side of the speaker amplifier 210 to which the buffer amplifier circuit 11, 31 is detachably connected, the microphone unit including the FET common-source type buffer amplifier circuit 11 or even the microphone unit including FET source-follower type buffer amplifier circuit 31 can be electrically connected to the speaker amplifier with the phase equalized.

The load resistor 13 in FIG. 2 and the load resistor 33 in FIG. 3 are provided in the microphone units 200 and 300, respectively, because it is advantageous in setting the resistance value according to the drain current and mutual conductance of FET 3. When such consideration is not necessary, however, the load resistor may be provided in the speaker amplifier 210.

Moreover, while in the embodiment of FIG. 3 the input end of the current mirror circuit 12 is connected to the power source, it may not be connected to anything as long as an AC signal is not supplied to the input end of the speaker amplifier 210 which is connected to the output end. In other words, a DC current may be caused to flow into the input end of the current mirror circuit 12 so long as it is a negligibly small amount of change. For example, it may be used for biasing the input portion of the apparatus which has a microphone connected or it may give information of what type of microphone is connected.

As is obvious from the above embodiments this invention can have the following effects.

(a) Since the output current of the buffer amplifier means and the output current of the current mirror means are not changed with the change of the power source voltage, the signal current proportional to the acoustic pressure signal is also not changed. As a result, the output voltage which is developed across the load resistor and proportional to the acoustic pressure signal is also not changed with the change of the power source voltage.

(b) Since the signal current from the buffer amplifier means is once changed in its direction by the current mirror means, the output voltage of the amplifier proportional to the acoustic pressure signal is inverted in its phase.

(c) Since the current mirror means and the connecting and disconnecting means for interfacing between the microphone unit and the input and output terminals of the current mirror means are provided in the apparatus, or in the speaker amplifier to which the buffer amplifier means is detachably connected, the output of the microphone unit of one type can be connected to the input end of the current mirror when this type unit has the buffer amplifier means of which the output end can be approximately regarded as a current source and the output of the microphone unit of the other type can be connected to the output end of the current mirror with no signal applied to the input end of the current mirror when this type has the buffer amplifier means of which the output end can be approximately regarded as a voltage source. Thus, even when the phase of the output signal from the buffer amplifier circuit of one type is different from that of the other type, the phase equalizing adjustment can be automatically performed without taking care of the connecting operation.

We claim:

1. An amplifier device for a condenser microphone comprising:

buffer amplifier means having an input of a large resistance and an output end approximately regarded as a current source; and current mirror means for changing a direction of an output current of said buffer amplifier means to invert a phase of said output current of said buffer amplifier means and having an output end which can be approximately regarded as a current source, the output end of said current mirror means serving as an output of said amplifier device, wherein said current mirror means reduces influence on the amplifier device of ripples from a power source.

2. An amplifier device for a condenser microphone, comprising:

current mirror means for inverting a phase of an output signal of the microphone and for reducing influence on the amplifier device of ripples from a power source;

first connecting and disconnecting terminals connected to an input end of said current mirror means; and second connecting and disconnecting terminals connected to an output end of said current mirror means, whereby buffer amplifier means can be detachably connected to said current mirror means.

3. An amplifier device according to claim 1, wherein an input-output transfer characteristic of said current mirror means is set to have a non-linearity in order to reduce a non-linearity caused in said buffer amplifier means.

4. An amplifier device according to claim 2, wherein an input-output transfer characteristic of said current mirror means is set to have a non-linearity in order to reduce a non-linearity caused in said buffer amplifier means.

5. An amplifier device according to claim 1, wherein said current mirror means comprises bipolar transistors.

6. An amplifier device according to claim 2, wherein said current mirror means comprises bipolar transistors.

7. An amplifier device according to claim 3, wherein said current mirror means comprises bipolar transistors.

8. An amplifier device according to claim 1, wherein said buffer amplifier means is combined with said condenser microphone to form a unit.

9. An amplifier device according to claim 2, wherein said buffer amplifier means is combined with said condenser microphone to form a unit.

10. An amplifier device according to claim 3, wherein said buffer amplifier means is combined with said condenser microphone to form a unit.

11. An amplifier device according to claim 4, wherein said buffer amplifier means is combined with said condenser microphone to form a unit.

12. An amplifier device for a condenser microphone, comprising:

a microphone capsule for converting an acoustic pressure signal into a voltage signal;

a buffer amplifier circuit including a field-effect transistor having a gate connected to said microphone capsule and a source that is grounded, said voltage signal from said microphone capsule being converted into a current signal by said buffer amplifier circuit;

a current mirror circuit for inverting a phase of said current signal output by said buffer amplifier circuit and for reducing influence on the amplifier device of ripples from a power source and including bipolar transistors, said current mirror circuit being connected to a drain of said field-effect transistor of said buffer amplifier circuit, said current mirror circuit having an equivalent AC resistance large enough to be regarded as a current source;

a load resistor connected to said current mirror circuit to produce a voltage signal proportional to a magnitude of said acoustic pressure signal applied to said microphone capsule; and a power amplifier circuit for amplifying said voltage signal generated at said load resistor and driving a loudspeaker.

13. An amplifier device for a condenser microphone, comprising:

a microphone unit including a microphone capsule for converting an acoustic pressure signal into a voltage signal, and a buffer amplifier circuit which has a field-effect transistor with a gate connected to said microphone capsule and a source that is grounded and which converts the voltage signal from said microphone capsule into a current signal, and a load resistor connected to a current mirror circuit so as to generate a voltage signal proportional to said acoustic pressure signal applied to said microphone capsule;

a speaker amplifier including said current mirror circuit which includes bipolar transistors and which is connected to a drain of said field-effect transistor of said buffer amplifier circuit to invert a phase of said current signal output by said buffer amplifier circuit and to reduce influence on the amplifier device of ripples from a power source, said current mirror circuit having an equivalent AC resistance large enough to be regarded as a current source, and a power amplifier circuit for amplifying the voltage signal generated from said load resistor and driving a loudspeaker; and connection means for detachably connecting said microphone unit and said speaker amplifier.

14. An amplifier device for a condenser microphone, comprising:

a microphone unit including a microphone capsule for converting an acoustic pressure signal into a voltage signal, and a buffer amplifier circuit which has a field-effect transistor with a gate connected to said microphone capsule and a source that is grounded through a load resistor and which converts the voltage signal from said microphone capsule into a current signal, said load resistor generating a voltage signal proportional to the magnitude of said acoustic pressure signal applied to said microphone capsule;

a speaker amplifier including a current mirror circuit which includes bipolar transistors and which is connected between a drain and a source of said field-effect transistor of said buffer amplifier circuit to invert a phase of said current signal output by said buffer amplifier circuit and to reduce influence on the amplifier device of ripples from a power source, said current mirror circuit having an equivalent AC resistance large enough to be regarded as a current source, and a power amplifier circuit for amplifying the voltage signal generated from said load resistor and driving a loudspeaker; and connection means for detachably connecting said microphone unit and said speaker amplifier.

* * * * *